United States Patent
Yamada et al.

(10) Patent No.: US 8,223,500 B2
(45) Date of Patent: Jul. 17, 2012

(54) MEMORY CARD AND METHOD FOR MANUFACTURING THE SAME

(75) Inventors: Yuichiro Yamada, Osaka (JP);
Hidenobu Nishikawa, Nara (JP);
Hiroyuki Yamada, Osaka (JP); Shuichi Takeda, Yamagata (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 12/664,475

(22) PCT Filed: May 26, 2008

(86) PCT No.: PCT/JP2008/001301
§ 371 (c)(1),
(2), (4) Date: Dec. 14, 2009

(87) PCT Pub. No.: WO2008/152774
PCT Pub. Date: Dec. 18, 2008

(65) Prior Publication Data
US 2010/0165587 A1    Jul. 1, 2010

(30) Foreign Application Priority Data
Jun. 15, 2007 (JP) .................. 2007-158090

(51) Int. Cl.
*H05K 7/02* (2006.01)
(52) U.S. Cl. ......... 361/737; 257/679; 235/492; 174/521
(58) Field of Classification Search .................. 361/737, 361/752; 174/521; 235/492; 257/679
See application file for complete search history.

(56) References Cited

U.S. PATENT DOCUMENTS

| 6,538,331 | B2 * | 3/2003 | Masuda et al. ................ 257/777 |
| 6,573,567 | B1 * | 6/2003 | Nishizawa et al. ............ 257/358 |
| 6,924,547 | B2 * | 8/2005 | Kanemoto et al. ............ 257/666 |
| 6,945,465 | B2 * | 9/2005 | Nishizawa et al. ............ 235/492 |
| 6,988,668 | B2 * | 1/2006 | Osako et al. ................... 235/492 |
| 6,998,721 | B2 * | 2/2006 | Zhou ............................. 257/790 |
| 7,037,756 | B1 * | 5/2006 | Jiang et al. .................... 438/109 |

(Continued)

FOREIGN PATENT DOCUMENTS

JP    2001-344587    12/2001

(Continued)

OTHER PUBLICATIONS

International Search Report issued Aug. 5, 2008 in International (PCT) Application No. PCT/JP2008/001301.

*Primary Examiner* — Dameon Levi
(74) *Attorney, Agent, or Firm* — Wenderoth, Lind & Ponack, L.L.P.

(57) ABSTRACT

A memory card includes a circuit board, semiconductor chips mounted on different areas on the circuit board, a semiconductor chip with a semiconductor electrode on its top face and being fixed such that at least a part of its bottom face faces at least a part of a top face of the semiconductor chip, a wire for connecting the semiconductor electrode and a board electrode on the circuit board to achieve a mounting state of the semiconductor chip, and a cover for covering a circuit formation area from an upper side of the circuit board. The circuit formation area includes three semiconductor chips and the wire. At least a part of each of three semiconductor chips, at least a part of the circuit board, and the wire are covered with secondary sealing resin and primary sealing resin.

12 Claims, 8 Drawing Sheets

U.S. PATENT DOCUMENTS

| | | | |
|---|---|---|---|
| 7,048,197 B2 * | 5/2006 | Nishizawa et al. | 235/492 |
| 7,055,757 B2 * | 6/2006 | Nishizawa et al. | 235/492 |
| 7,224,052 B2 * | 5/2007 | Nishizawa et al. | 257/679 |
| 7,234,644 B2 * | 6/2007 | Nishizawa et al. | 235/492 |
| 7,294,530 B2 * | 11/2007 | Zhou | 438/107 |
| 7,322,531 B2 * | 1/2008 | Osawa et al. | 235/492 |
| 7,348,668 B2 * | 3/2008 | Masuda et al. | 257/723 |
| 7,467,464 B2 * | 12/2008 | Osawa et al. | 29/841 |
| 7,485,491 B1 * | 2/2009 | Miks et al. | 438/106 |
| 7,545,048 B2 * | 6/2009 | Meyer et al. | 257/777 |
| 7,547,961 B2 * | 6/2009 | Nishizawa et al. | 257/679 |
| 7,933,127 B2 * | 4/2011 | Nishikawa et al. | 361/735 |
| 7,939,923 B2 * | 5/2011 | Nishikawa et al. | 257/679 |
| 8,018,038 B2 * | 9/2011 | Nishizawa et al. | 257/679 |
| 2001/0025721 A1 | 10/2001 | Maeda et al. | |
| 2003/0227075 A1 | 12/2003 | Kanemoto et al. | |
| 2006/0087016 A1 | 4/2006 | Wada et al. | |
| 2007/0013083 A1 | 1/2007 | Kikuchi et al. | |

FOREIGN PATENT DOCUMENTS

| | | |
|---|---|---|
| JP | 2004-013738 | 1/2004 |
| JP | 2005-166891 | 6/2005 |
| JP | 2006-119983 | 5/2006 |
| JP | 2007-027287 | 2/2007 |

* cited by examiner

MEMORY CARD AND METHOD FOR MANUFACTURING THE SAME

TECHNICAL FIELD

The present invention relates to memory cards that include a semiconductor chip mounted on a circuit board, and to manufacturing methods of these memory cards.

BACKGROUND ART

A memory card, an information-recording medium, is commonly employed in mobile electronic devices, such as mobile phones, due to its space-saving design.

More features and higher portability are ever-greater demand for mobile electronic devices, leading to a need for smaller and higher-capacity memory cards. A further smaller and thinner memory card has been standardized, and this has prompted study of how to achieve higher capacity within the standardized dimensions of the memory card.

In response to these demands, a technology for making memory cards thinner has been disclosed (for example, refer to Patent Literature 1). More specifically, a memory chip is laminated in a positionally-displaced manner on another memory chip on a lead frame. Electrodes of the two memory chips and the electrode of a control chip placed on the lead frame are then connected to the lead frame, using a gold wire, to achieve a thinner memory card.

However, in the memory card disclosed in Patent Literature 1, electrodes are needed on the lead frame for wire-bonding all the memory chips and the control chip. This requires space for the electrodes and space for carrying the wire that links the electrodes or connects to the external electrodes. This impedes the downsizing of the memory card or mounting of a high-capacity memory chip that has a larger area.

In addition, to sterically-cross wires, narrow-pitch or long wiring is needed at some connecting points. Therefore, to seal narrow-pitch wiring with filling resin, low-viscosity thermosetting resin needs to be used, which has the disadvantages of a long curing time, a limited selection of processes or materials, and a limited reduction of manufacturing costs.

Furthermore, the quality of each mounted chip can be inspected only after all the chips have been mounted and sealed. Therefore, if a mounting failure has occurred in the first mounted chip, this mounting failure is not detectable until all the chips are in place and sealed. This results in lower yields and thus higher manufacturing costs.

Patent Literature 1: Japanese Patent Unexamined Publication No. 2004-13788

SUMMARY OF THE INVENTION

A memory card of the present invention includes a circuit board with at least a substrate electrode on its top face and an external electrode on its bottom face; a first semiconductor chip with a first semiconductor electrode mounted on the top face of the circuit board; a third semiconductor chip with a third semiconductor electrode mounted on the top face of the circuit board in an area different from the area where the first semiconductor chip is mounted; a second semiconductor chip with a second semiconductor electrode on its top face; a wire for connecting the second semiconductor electrode and the board electrode; and a cover on the top face of the circuit board for covering the circuit formation area, which includes the first semiconductor chip, the second semiconductor chip, the third semiconductor chip, and the wire. At least a part of the bottom face of the second semiconductor chip and a part of the top face of the first semiconductor chip face each other and are fixed. At least a part of the first semiconductor chip, a part of the second semiconductor chip, a part of the third semiconductor chip, a part of the circuit board, and a wire are covered with sealing resin.

This structure allows separate mounting of the first semiconductor chip, the second semiconductor chip, and the third semiconductor chip on the circuit board to achieve a memory card with high capacity. Since each semiconductor chip is mounted separately, mounting failure is detectable between the circuit board and each or combined semiconductor chips. Furthermore, the first semiconductor chip and the third semiconductor chip are wired for electrical connection to the circuit board using an area where the bottom faces of these semiconductor chips and the top face of the circuit board face each other.

Still more, since the second semiconductor electrode of the second semiconductor chip is connected to the board electrode on the circuit board via a wire, there is no need to positionally-displace the first semiconductor chip and the second semiconductor chip relatively when connecting them to the circuit board. Only the second semiconductor chip is connected via a wire. Accordingly, the first semiconductor chip and the second semiconductor chip do not necessarily be positionally-displaced. As a result, the number of wires and board electrodes can be drastically reduced.

The first semiconductor chip and third semiconductor chip can be mounted on the circuit board using a wide range of adhesives or sealing materials and by applying pressure, heat or UV rays. This ensures thin reliable sealing, and reduces overall height. Furthermore, the number of connections using wire between the second semiconductor chip and the circuit board can be reduced, avoiding the need for fine-pitch connection of the board electrodes. As a result, sealing of a limited area becomes reliable and easy without the need for using low-viscosity sealing material.

A method of manufacturing the memory card of the present invention includes the steps of mounting the first semiconductor chip on the top face of the circuit board; mounting the third semiconductor chip on the top face of the circuit board in an area different from the area where the first semiconductor chip is mounted; fixing the bottom face of the second semiconductor chip and the top face of the first semiconductor chip using a fixing material such that at least a part of the faces oppose each other; connecting the semiconductor electrode on the top face of the second semiconductor chip to the board electrode on the top face of the circuit board using a wire; and sealing at least a part of the first semiconductor chip, a part of second semiconductor chip, a part of the third semiconductor chip, a part of the circuit board, and wire using sealing resin; and covering the circuit formation area including the first semiconductor chip, the second semiconductor chip, third semiconductor chip, and the wire provided on the top face of the circuit board.

This method enables the manufacture of high-capacity and sophisticated memory cards at low cost and high productivity.

Figure 1:
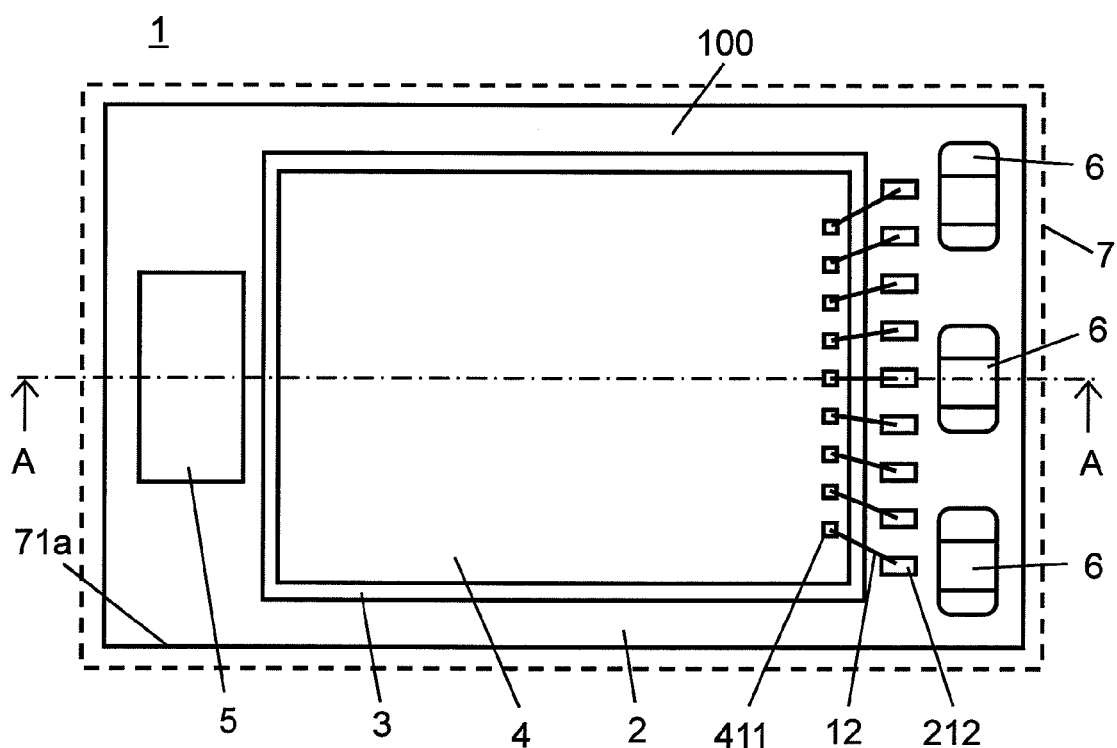
FIG. 1 is a plan view of an internal structure of a memory card in accordance with a first exemplary embodiment of the present invention.

REFERENCE MARKS IN THE DRAWINGS 1, 1a, 1b Memory card
2 Circuit board
3 First semiconductor chip
4 Second semiconductor chip
5 Third semiconductor chip
6 Non-semiconductor chip component
7 Cover
7a Opening
8 Fixing material
9 Solder paste
10 Secondary sealing resin
11 Primary sealing resin
12 Wire
21, 31, 41, 51 Top face
22, 32, 42, 52, 61 Bottom face
33 First semiconductor electrode
53 Third semiconductor electrode
71 Cavity
71a First concave portion
71b Second concave portion
100 Circuit formation area
101 Facing area
103 Dam
211, 212, 213 Board electrode
221 External electrode
411 Second semiconductor electrode

DETAILED DESCRIPTION OF PREFERRED EMBODIMENTS

Exemplary embodiments of the present invention are described below with reference to drawings. Same reference marks may be given to same components to omit duplicate description.

First Exemplary Embodiment

Figure 2:
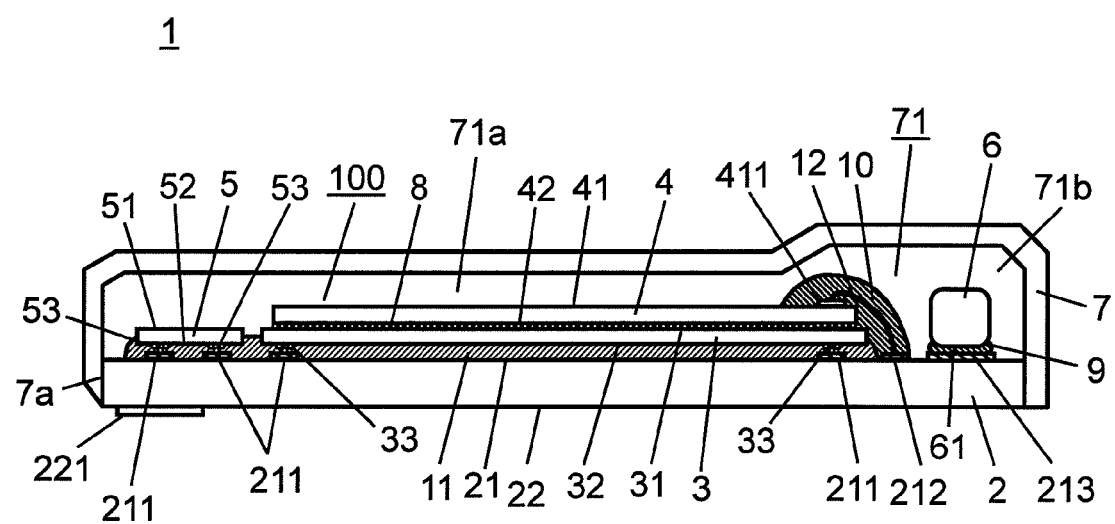
FIG. 2 is a sectional view taken along line A-A in the memory card in FIG. 1.

FIG. 1 is a plan view of an internal structure of a memory card in the first exemplary embodiment of the present invention. FIG. 2 is a sectional view taken along line A-A in the memory card in FIG. 1. In FIG. 1, only the outline of cover 7 is indicated with a dotted line to facilitate understanding of the internal structure of the memory card. In FIG. 2, primary sealing resin 11 and secondary sealing resin 10 are omitted from illustration.

The first exemplary embodiment refers to an SD memory card (Security Digital memory card) as a typical example of memory cards in the following description. In general, the length and width (sizes in the horizontal and vertical directions in FIG. 1) and thickness (a size in the vertical direction in FIG. 2) of the SD memory card are 14.9 mm to 15.1 mm, 10.9 mm to 11.1 mm, and 0.9 mm to 1.1 mm, respectively. In this exemplary embodiment, dimensions are 15 mm, 11 mm, and 1 mm, respectively. For convenience, the top and bottom sides of FIG. 2 are described as the top and bottom sides of memory card 1. This is the same in other exemplary embodiment. Thicknesses of memory card 1 at areas where first semiconductor chip 3, second semiconductor chip 4, and third semiconductor chip 5 are mounted are 0.6 mm to 0.8 mm (0.7 mm in this exemplary embodiment).

As shown in FIGS. 1 and 2, memory card 1 includes circuit board 2 with at least board electrode 211 on its top face 21 and external electrode 221 on its bottom face 22; first semiconductor chip 3 with first semiconductor electrode 33 mounted; third semiconductor chip 5 with third semiconductor electrode 53 mounted on top face 21 of circuit board 2 in an area different from the area where first semiconductor chip 3 is mounted on top face 21 of circuit board 2; second semiconductor chip 4 with second semiconductor electrode 411 on its top face 41; wire 12 for connecting second semiconductor electrode 411 and board electrode 212; and cover 7 for covering circuit formation area 100 including first semiconductor chip 3, second semiconductor chip 4, third semiconductor chip 5, and wire 12 provided on top face 21 of circuit board 2. At least a part of bottom face 42 of second semiconductor chip 4 and a part of top face 31 of first semiconductor chip 3 face each other and are fixed. At least a part of each of first semiconductor chip 3, second semiconductor chip 4, third semiconductor chip 5, and circuit board 2, and wire 12 are covered with sealing resin including primary sealing resin 11 and secondary sealing resin 10.

Circuit board 2 is made of, for example, a glass epoxy substrate equivalent to FR-4.5, and its thickness is 0.1 mm to 0.4 mm (0.16 mm in this exemplary embodiment). Board electrodes 211, 212, and 213 provided on top face 21 of circuit board 2 are electrically coupled with wiring (not illustrated) provided on top face 21. Multiple external electrodes 221 are provided on bottom face 22 of circuit board 2 for establishing a connection to an external electronic device (not illustrated). External electrodes 221 are electrically coupled with wiring provided on top face 21 of circuit board 2 via wiring (not illustrated) provided on bottom face 22 of circuit board 2 through via holes (not illustrated) from bottom face 22 to top face 21 of circuit board 2.

First semiconductor chip 3 and second semiconductor chip 4 are memory chips storing, for example, information. Third semiconductor chip 5 is, for example, a control chip that controls first semiconductor chip 3 and second semiconductor chip 4. In this exemplary embodiment, first semiconductor chip 3, second semiconductor chip 4, and third semiconductor chip 5 are bare chips, and their thicknesses are 0.05 mm to 0.3 mm, respectively.

First semiconductor chip 3 has protruding first semiconductor electrode 33 formed on an electrode (not illustrated) on its bottom face 32, and this first semiconductor electrode 33 is bonded (including an electrically-coupled state by making contact) to board electrode 211 on the top face of circuit board 2. Third semiconductor chip 5 has protruding third semiconductor electrode 53 formed on an electrode (not illustrated) on its bottom face 52. This third semiconductor electrode 53 is bonded (including a contact state) to board electrode 211 of circuit board 2. At least a part of each of bottom face 32 of first semiconductor chip 3, bottom face 52 of third semiconductor chip 5, and top face 21 of circuit board 2 is sealed with primary sealing resin 11.

In addition, at least a part of bottom face 42 of second semiconductor chip 4 is disposed facing at least a part of top face 31 of first semiconductor chip 3. Second semiconductor chip 4 is fixed and laminated onto first semiconductor chip 3 using fixing material 8 such as adhesive, which is provided between top face 31 of first semiconductor chip 3 and bottom face 42 of semiconductor chip 4 facing each other. Still more, second semiconductor electrode 411 formed on top face 41 of second semiconductor chip 4 is bonded to board electrode 212 of circuit board 2 by wire 12, and is sealed with secondary sealing resin 10. This establishes electrical connection between second semiconductor chip 4 and circuit board 2 by wire 12. Second semiconductor chip 4 and first semiconductor chip 3 are disposed in parallel, and first semiconductor chip 3 and second semiconductor chip 4 are not directly connected.

Non-conductive liquid resin material, such as epoxy resin, is used as secondary sealing resin 10, and is applicable to wire 12, a part of second semiconductor chip 4, a part of first semiconductor chip 3, and a part of top face 21 of circuit board 2. As primary sealing resin 11, a film-like non-conductive resin material (NCF: Non-conductive Film), for example, that can be attached to top face 21 of circuit board 2 is used.

As shown in FIGS. 1 and 2, bottom face 61 of non-semiconductor chip component 6, such as a capacitor, may be mounted on top face 21 of circuit board 2 as required for the purpose of removing noise, for example. In this case, multiple non-semiconductor chip components 6 are aligned along one side of circuit board 2, for example, as shown in FIG. 1. Then, as shown in FIG. 2, these non-semiconductor chip components 6 are mounted and connected to board electrodes 213 on top face 21 of circuit board 2 typically by solder paste 9. Board electrodes 212, which are connected to second semiconductor electrodes 411 of second semiconductor chip 4 by wires 12, are aligned on top face 21 of circuit board 2 between aligned non-semiconductor chip components 6 and first semiconductor chip 3.

As shown in FIG. 2, cover 7 has cavity 71. This cavity 71 includes first concave portion 71a for housing first semiconductor chip 3, second semiconductor chip 4, and third semiconductor chip 5; and second concave portion 71b for housing secondary sealing resin 10 that seals connection between second semiconductor electrodes 411 of second semiconductor chip 4 and board electrodes 212 by wires 12, and non-semiconductor chip component 6. In this exemplary embodiment, the height (depth) of second concave portion 71b is designed higher than the height (depth) of first concave portion 71a. In this case, cover 7 is made of thermoplastic resin, such as polycarbonate and polyethylene terephthalate, and is fitted with an outer periphery of circuit board 2 via opening 7a in cavity 71.

The above structure achieves the memory card with high capacity in which the first semiconductor chip, second semiconductor chip, and third semiconductor chip are independently mounted on the circuit board. Since each semiconductor chip is mounted independently, the quality of mounting of each or combined semiconductor chips onto the circuit board can be checked separately, such as by evaluating electrical characteristic.

The first semiconductor chip and the third semiconductor chip are electrically coupled with the circuit board by wiring formed on a facing area between their bottom faces and the top face of circuit board. Therefore, only the second semiconductor electrodes of the second semiconductor chip are connected to the board electrodes of the circuit board by wires. This eliminates the need for positional displacement of the first semiconductor chip and the second semiconductor chip, relative to each other, so as to connect them to the circuit board by wires. In other words, only the second semiconductor chip is connected by wires, and thus positional displacement of the first semiconductor chip and the second semiconductor chip is not necessary. As a result, the number of wires and the number of board electrodes for electrical connection can be drastically reduced. This prevents a fine pitch for the board electrodes. Accordingly, a sealing material with low viscosity is not necessary as the secondary sealing resin. A sealing material with high viscosity is sufficient for easily and reliably sealing the area connected by wires.

In addition, the first semiconductor chip and the third semiconductor chip can be mounted on the circuit board using a fixing material, such as a range of adhesives and sealing materials, by applying pressure, heat, or UV rays. This ensures thin and reliable sealing, and reduces overall height.

Still more, in the first exemplary embodiment, first semiconductor chip 3 and third semiconductor chip 5 are directly mounted on wiring formed in areas where first semiconductor chip 3 and third semiconductor chip 5 face circuit board 2. First semiconductor chip 3 and second semiconductor chip 4 are laminated on circuit board 2, and board electrodes 212 provided on a periphery are connected with second semiconductor electrodes 411 by a small number of wires 12. This achieves a thin and small memory card with high capacity.

Still more, in the first exemplary embodiment, the quality of mounting of first semiconductor chip 3, second semiconductor chip 4, and third semiconductor chip 5 to circuit board 2 can be determined by inspecting electrical characteristic at each mounting step independently or in combination. This improves yields and reduces the cost of the memory card.

Still more, in the first exemplary embodiment, first semiconductor chip 3 and third semiconductor chip 5 are mounted on circuit board 2 using primary sealing resin 11 for reliable and thin sealing. In addition, the number of connections using wire 12 can be reduced. This avoids a fine-pitch connection, and thus eliminates need for a sealing material with low viscosity for secondary sealing resin 10. Accordingly, a connection area between second semiconductor electrodes 411 and board electrodes 212, where wires 12 are used, can be easily and securely sealed so as to establish reliable electrical connection.

Still more, in the first exemplary embodiment, cover 7 for protecting circuit formation area 100 can be easily thinned and downsized relative to the size of circuit formation area 100. Accordingly, a slim memory card can be realized.

Furthermore, the first exemplary embodiment achieves highly-reliable and sophisticated memory card 1 by providing non-semiconductor chip component 6.

Next, a method of manufacturing the memory card in the first exemplary embodiment of the present invention is described with reference to FIGS. 3A, 3B, and 4A to 4E.

Figure 3A:
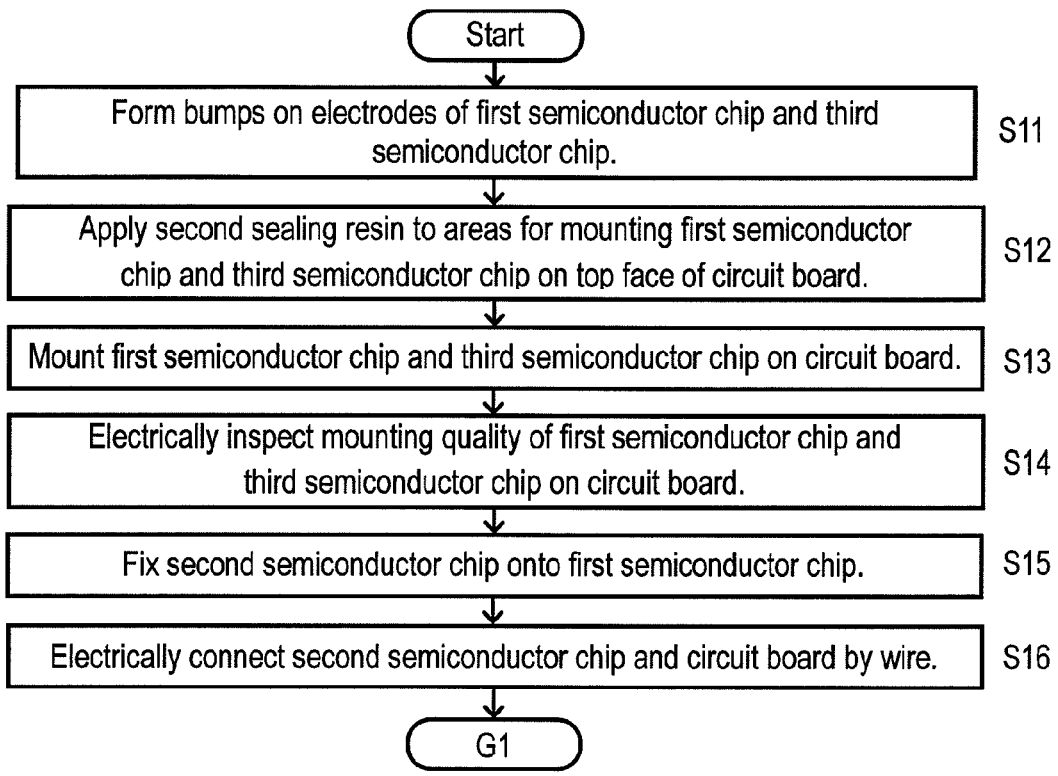
FIG. 3A is a flow chart illustrating a manufacturing process of the memory card in accordance with the first exemplary embodiment of the present invention.
Figure 3B:
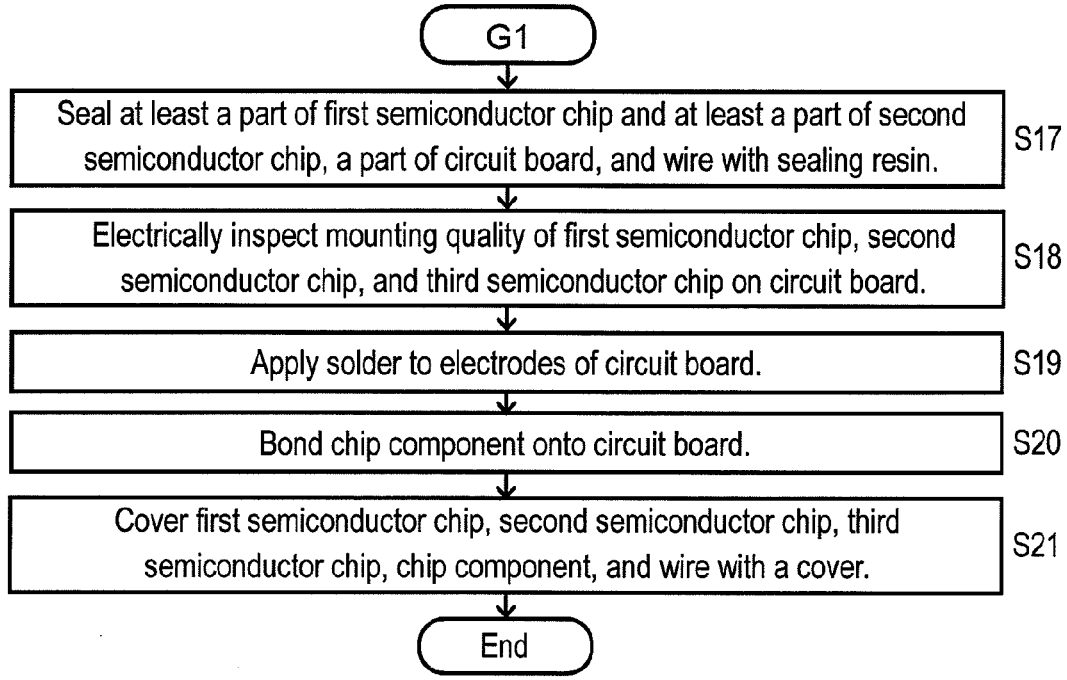
FIG. 3B is a flow chart illustrating the manufacturing method of the memory card in accordance with the first exemplary embodiment of the present invention.

FIGS. 3A and 3B are flow charts illustrating the method of manufacturing the memory card in the first exemplary embodiment of the present invention. FIGS. 4A to 4E are sectional views illustrating the method of manufacturing the memory card in the first exemplary embodiment of the present invention.

Figure 4A:
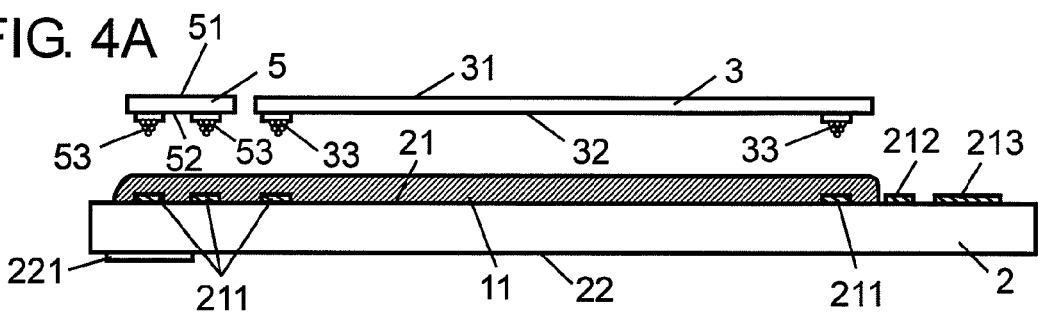
FIG. 4A is a sectional view illustrating the manufacturing method of the memory card in accordance with the first exemplary embodiment of the present invention.

First, as shown in FIGS. 3A and 4A, a bump is formed on an electrode (not illustrated) on bottom face 32 of first semiconductor chip 3 as first semiconductor electrode 33. A bump is also formed on an electrode (not illustrated) on bottom face 52 of third semiconductor chip 5 as third semiconductor electrode 53 (Step S11).

Primary sealing resin 11, such as NCF, is applied to areas on top face 21 of circuit board 2 where first semiconductor chip 3 and third semiconductor chip 5 will be mounted (by a flip-chip method). Here, no primary sealing resin 11 is applied to board electrodes 212 and 213 on circuit board 2. Primary sealing resin 11 is thus provided on board electrodes 211 (Step S12).

Then, bottom face 32 of first semiconductor chip 3 is held facing top face 21 of circuit board 2 by a mounter (not illustrated). After adjusting the position of first semiconductor chip 3 such that it faces board electrodes 211 via primary sealing resin 11, first semiconductor chip 3 is pressed against circuit board 2. In the same way, bottom face 52 of third semiconductor chip 5 is held facing top face 21 of circuit board 2 by the mounter. After adjusting the position of third semiconductor chip 5 such that it faces board electrode 211 via primary sealing resin 11, third semiconductor chip 5 is pressed against circuit board 2. Then, first semiconductor chip 3 and third semiconductor chip 5 are heated in a state that first semiconductor chip 3 and third semiconductor chip 5 are pressed against circuit board 2, so as to electrically couple first semiconductor electrode 33 of first semiconductor chip 3 and third semiconductor electrode 53 of third semiconductor chip 5 with board electrodes 211 of circuit board 2.

Figure 4B:
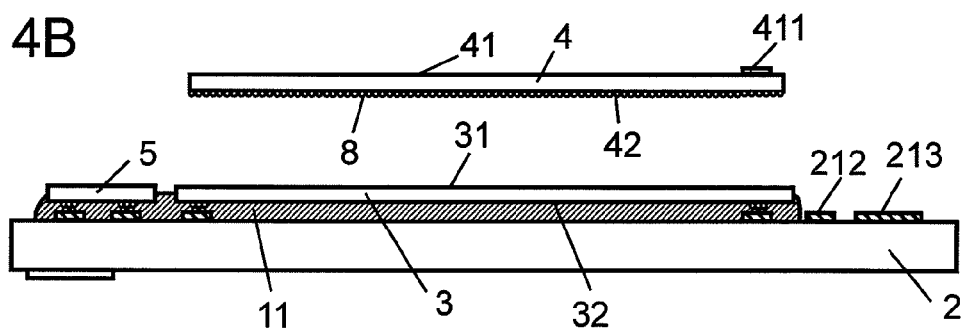
FIG. 4B is a sectional view illustrating the manufacturing method of the memory card in accordance with the first exemplary embodiment of the present invention.

When primary resin 11 is cured, first semiconductor chip 3 and third semiconductor chip 5 are mounted and electrically coupled with circuit board 2, as shown in FIG. 4B (Step S13).

In subsequent descriptions, first semiconductor chip 3 and third semiconductor chip 5 mounted on circuit board 2 are referred to as "Primary mounting module."

As shown in FIG. 3A, the primary mounting module is electrically inspected using an inspection device (not illustrated). For example, the quality of mounting of first semiconductor chip 3 and third semiconductor chip 5 to circuit board 2, respectively, is electrically inspected separately by applying electricity to the primary mounting module via circuit board 2 (Step S14). This enables selection of non-defective primary mounting modules.

Next, as shown in FIGS. 3A and 4B, second semiconductor chip 4 is prepared. Film-like fixing material 8 mainly made of thermosetting resin, for example, is transferred onto bottom face 42 of second semiconductor chip 4, and second semiconductor chip 4 is cut out from a wafer using a dicer (not illustrated). Bottom face 42 of second semiconductor chip 4 are held facing top face 31 of first semiconductor chip 3, as shown in FIG. 4B, by a die-bonder (not illustrated). After adjusting second semiconductor chip 4 to a predetermined position, second semiconductor chip 4 is pressed against first semiconductor chip 3 via fixing material 8. Then, second semiconductor chip 4, first semiconductor chip 3, and circuit board 2 are heated by a heater (not illustrated) so as to cure fixing material 8 and fix second semiconductor chip 4 onto first semiconductor chip 3 (Step S15).

Figure 4C:
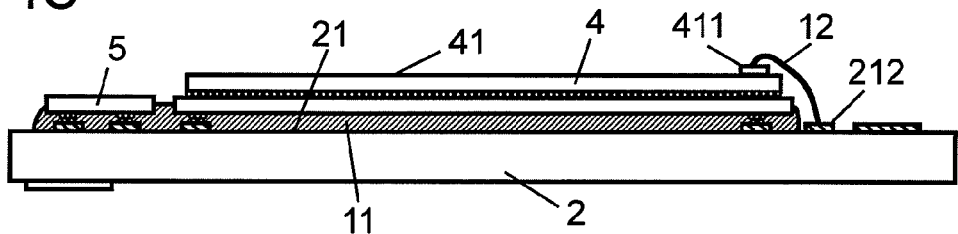
FIG. 4C is a sectional view illustrating the manufacturing method of the memory card in accordance with the first exemplary embodiment of the present invention.

Next, as shown in FIGS. 3A and 4C, second semiconductor electrode 411 on second semiconductor chip 4 and board electrode 212 on circuit board 2 are electrically coupled by wire 12, such as a gold wire (Step S16).

Figure 4D:
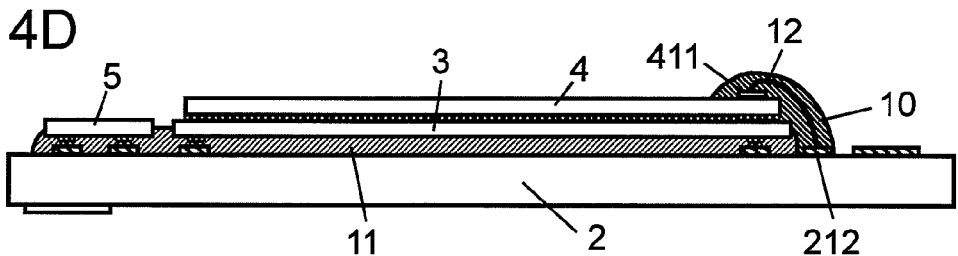
FIG. 4D is a sectional view illustrating the manufacturing method of the memory card in accordance with the first exemplary embodiment of the present invention.

Next, as shown in FIGS. 3B and 4D, secondary sealing resin 10 made of non-conductive liquid resin material mainly composed of thermosetting resin, such as epoxy resin, is applied to cover at least a part of each of first semiconductor chip 3 and second semiconductor chip 4, a part of circuit board 2, and wire 12 by a dispenser or injection unit (not illustrated). Secondary sealing resin 10 is then heated and cured by a heater (not illustrated) so as to seal at least a part of each of first semiconductor chip 3 and second semiconductor chip 4, a part of circuit board 2, and wire 12 (Step S17). If third semiconductor chip 5 is disposed near wire 12, at least a part of third semiconductor chip is also sealed with secondary sealing resin 10 in the same way.

The second semiconductor chip mounted on the primary mounting module is referred to as a "secondary mounting module" as a whole in the following description.

Next, as shown in FIG. 3B, the secondary mounting module is electrically inspected using an inspection device (not illustrated). For example, the quality of mounting of first semiconductor chip 3, second semiconductor chip 4, and third semiconductor chip 5 to circuit board 2 are electrically inspected by applying electricity to the secondary module via circuit board 2 (Step 18). This enables selection of non-defective secondary mounting modules.

Figure 4E:
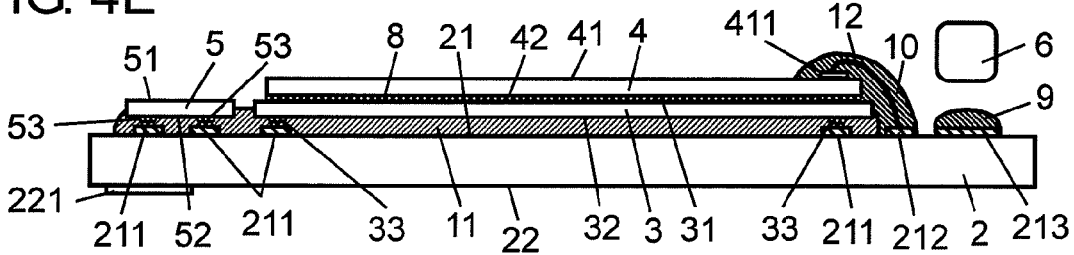
FIG. 4E is a sectional view illustrating the manufacturing method of the memory card in accordance with the first exemplary embodiment of the present invention.

Next, as shown in FIGS. 3B and 4E, solder paste 9 is provided on board electrode 213, using a mask, on top face 21 of circuit board 2 of a selected secondary mounting module, as required (Step S19). Then, non-semiconductor chip component 6, such as a capacitor, is placed on board electrode 213 of circuit board 2 via solder paste 9. After placing non-semiconductor chip component 6, the secondary mounting module is reflow-soldered. This electrically couples and bonds non-semiconductor chip component 6 and board electrode 213 on top face 21 of circuit board 2 (Step S20).

Next, as shown in FIGS. 2 and 3B, cover 7 is attached to circuit board 2 via opening 7a in its cavity 71. In this way, first semiconductor chip 3, second semiconductor chip 4, third semiconductor chip 5, non-semiconductor chip component 6, and wire 12 are housed inside cavity 71 of cover 7 on the side of top face 21 of circuit board 2, completing memory card 1 (Step S21).

As described above, board electrodes 211 of circuit board 2, which are connected to first semiconductor chip 3 and third semiconductor chip 5, can be disposed under first semiconductor chip 3 and third semiconductor chip 5 in the first exemplary embodiment. In addition, board electrodes 211 can be wired for connection under first semiconductor chip 3 and third semiconductor chip 5. Accordingly, only a space for providing board electrodes 212 connected to second semiconductor chip 4 by wire-bonding is needed on circuit board 2, in addition to a space for mounting first semiconductor chip 3, third semiconductor chip 5, and non-semiconductor chip component 6. This enables reduction of the number of layers in circuit board 2, making a thinner memory card feasible. In addition, a larger semiconductor chip, such as a memory chip, with higher capacity can be placed in a limited mounting area on the circuit board. As a result, a small memory card with high capacity is achievable.

Still more, in the first exemplary embodiment, electrical inspection is applied to the primary mounting module. Accordingly, second semiconductor chip 4 is mounted only on selected non-defective primary mounting module. Electrical inspection is also applied to the secondary mounting module, as required, so as to mount non-semiconductor chip component 6 only on selected non-defective secondary mounting module. This enables efficient manufacture of memory cards at low cost by reducing material and time losses.

Still more, in the first exemplary embodiment, first semiconductor electrode 33 of first semiconductor chip 3, third semiconductor electrode 53 of third semiconductor chip 5, and board electrodes 211 can be mounted and bonded together via the primary sealing resin. As a result, the manufacturing cost can be reduced by drastically reducing the manufacturing time in comparison with that of the prior art in which all semiconductor chips are wire-bonded onto circuit board 2.

Still more, in the first exemplary embodiment, second semiconductor electrode 411 of second semiconductor chip 4 and board electrode 212 are connected to the primary mounting module by wire 12, and only a minimum area around them is sealed with secondary sealing resin 10 to complete the secondary mounting module. Therefore, if only second semiconductor chip 4 is evaluated to be defective in electrical inspection, only a wire for power supply to second semiconductor chip 4 exposed on top face 21 of circuit board 2 can be cut to stop the operation of second semiconductor chip 4. This still enables the efficient use of a memory card as a card having a capacity of the primary mounting module. As a result, material and component losses can be drastically reduced.

On the other hand, if all semiconductor chips are mounted on the circuit board by wire-bonding, as in the prior art, wires need to be sealed. For this purpose, in general, the entire top face of circuit board is molded using the transfer-molding method such that wires are covered using thermosetting resin with low viscosity. Then, a molded portion and circuit board are processed into a predetermined shape of memory card typically by cutting.

Contrary, in the first exemplary embodiment, only an area near wire 12 connecting the second semiconductor chip and the circuit board is sealed with secondary sealing resin 10, and cover 7 made by molding inexpensive thermoplastic resin is attached. This simplifies the manufacture, and leads to the manufacture of memory cards at high productivity and low cost.

Still more, in the first exemplary embodiment, second semiconductor electrodes 411 are not formed on the side adjacent to third semiconductor chip 5 on top face 41 of second semiconductor chip 4. This eliminates the need for board electrodes 212 connected to second semiconductor electrode 411 of second semiconductor chip 4 on top face 21 of circuit board 2 at an area where first semiconductor chip 3 and third semiconductor chip 5 are disposed side by side. In the prior art, a wiring layer is formed on a bottom layer and interlayers are connected through via holes by using, for example, a multilayer circuit board, in order to further form board electrodes between finely-pitched board electrodes. This is not needed in the present invention. Still more, wiring for directly connecting first semiconductor chip 3 and third semiconductor chip 5 can be formed in the shortest distance via an adjacent area on top face 21 of circuit board 2. The use of circuit board 2 with less number of layers can make the memory card thinner. Still more, wiring in an area other than an area between first semiconductor chip 3 and third semiconductor chip 5 can be reduced. This allows placement of a larger semiconductor chip in a limited mounting area on the circuit board. Accordingly, a small memory card with high capacity is achievable.

The first exemplary embodiment refers to an example of disposing first semiconductor electrodes 33 of first semiconductor chip 3 to the left and right, as shown in the sectional view in FIG. 2. However, the present invention is not limited to these positions. For example, with reference to FIG. 2, though not illustrated, first semiconductor electrodes 33 may be disposed only on one side of first semiconductor chip 3, although not illustrated. More specifically, for example, first semiconductor electrode 33 disposed on the left side of first semiconductor chip 3 may be eliminated and disposed on the right side. In this case, second semiconductor electrodes 411 may be disposed on top face 41 of second semiconductor chip 4 on a side facing the right side where first semiconductor electrode 33 exists. In this way, first semiconductor chip 3 and second semiconductor chip 4 can be cross-wired in a broader area on top face 21 of circuit board 2 by including an area immediately under first semiconductor chip 3. Still more, L/S (line and space) of wiring can be broadened by the use of circuit board 2 with less number of layers. As a result, the cost of circuit board can be reduced, and the manufacturing cost of memory card can also be reduced.

Another example of the memory card in the first exemplary embodiment of the present invention is described next with reference to FIGS. 5 and 6.

Figure 5:
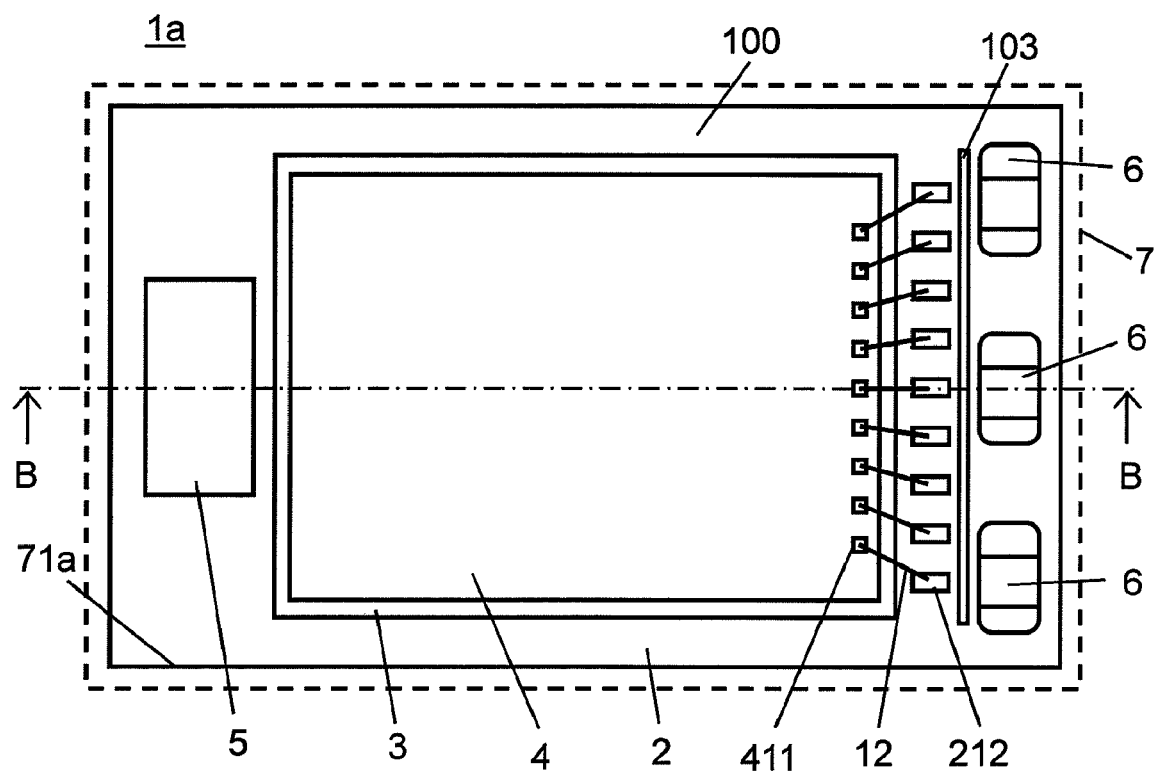
FIG. 5 is a plan view of an internal structure of another memory card in accordance with the first exemplary embodiment of the present invention.

FIG. 5 is a plan view of an internal structure of another example of the memory card in the first exemplary embodiment of the present invention. FIG. 6 is a sectional view taken along line B-B in the memory card in FIG. 5.

Figure 6:
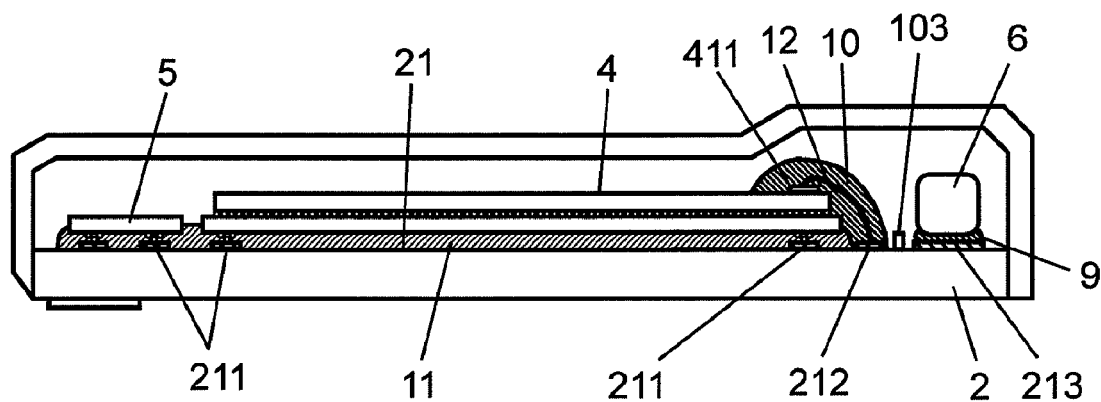
FIG. 6 is a sectional view taken along line B-B in the memory card in FIG. 5.

As shown in FIGS. 5 and 6, memory card 1a, which is another example of the first exemplary embodiment of the present invention, has dam 103 between non-semiconductor chip component 6 and secondary sealing resin 10 on top face 21 of circuit board 2. In this case, at least one line of dam 103 is formed between board electrodes 212 and board electrodes 213 on top face 21 of circuit board 2, such as by using solder resist, in a width of 0.1 mm to 1 mm and height of 0.01 mm to 0.1 mm.

This prevents spreading of secondary sealing resin 10 to board electrodes 213 when secondary sealing resin 10 is applied to top face 21 of circuit board 2. Accordingly, a mounting failure of non-semiconductor chip component 6 is preventable so as to reduce the manufacturing cost. Still more, since a distance between board electrodes 212 and board electrodes 213 can be shortened, a larger semiconductor chip with further higher memory capacity can be placed in a limited mounting area. As a result, memory card 1a that can be easily downsized and increase capacity is achievable.

The above refers to an example of providing dam 103 between board electrodes 212 and board electrodes 213. However, the present invention is not limited to this structure. For example, dam 103 may be provided between board electrodes 212 and board electrodes 211 adjacent to them. This prevents spreading of primary sealing resin 11 to board electrodes 212 and covering board electrodes 212 when first semiconductor electrode 33 of first semiconductor chip 3 is pressed and bonded to board electrode 211 of circuit board 2.

If the number of connections between board electrodes 212 and second semiconductor electrodes 411 increases, and thus filling of secondary sealing resin 10 is reduced due to a finer pitch between wires 12, a pitch between wires 12 is preferably broadened partially. This facilitates entry of secondary sealing resin 10 through a partially-broadened space between wires 12, achieving efficient filling of the space on circuit board 2. As a result, a portion with insufficient secondary sealing resin 10 and occurrence of void can be reduced. Accordingly, a high-quality memory card is achievable at low manufacturing cost and with less losses.

Second Exemplary Embodiment

Figure 7:
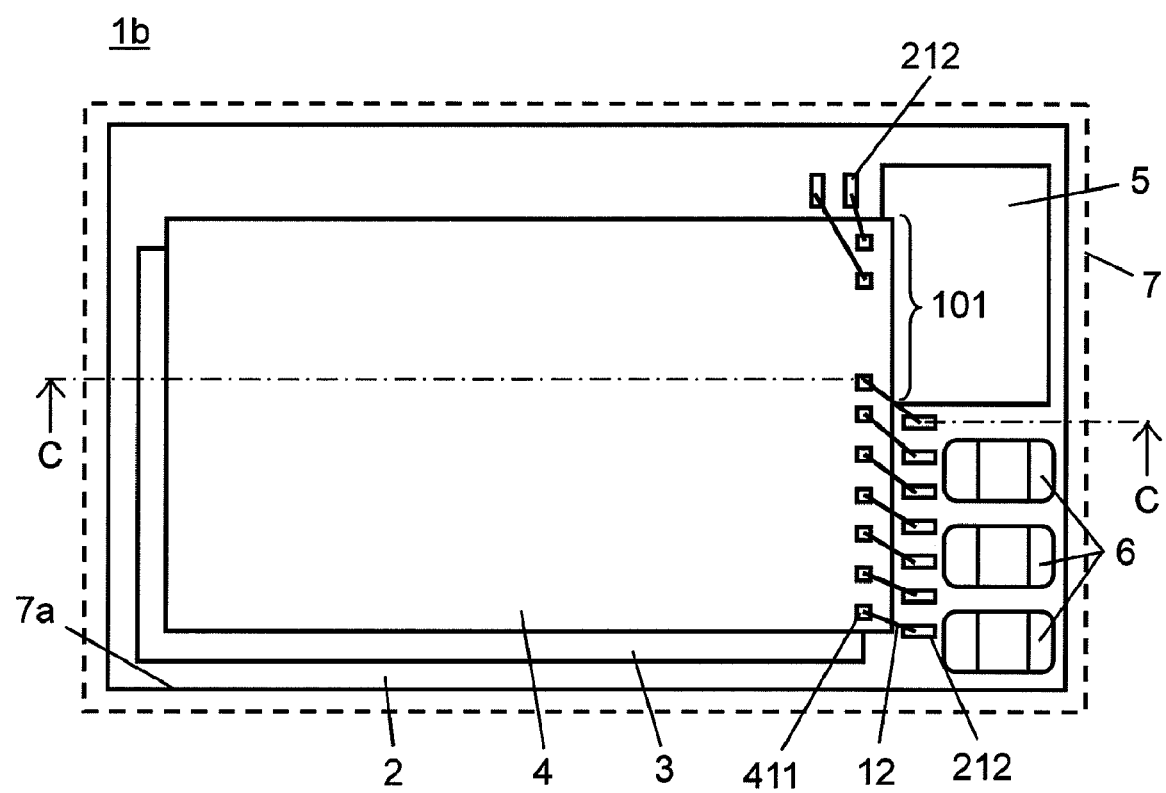
FIG. 7 is a plan view of an internal structure of a memory card in accordance with a second exemplary embodiment of the present invention.
Figure 8:
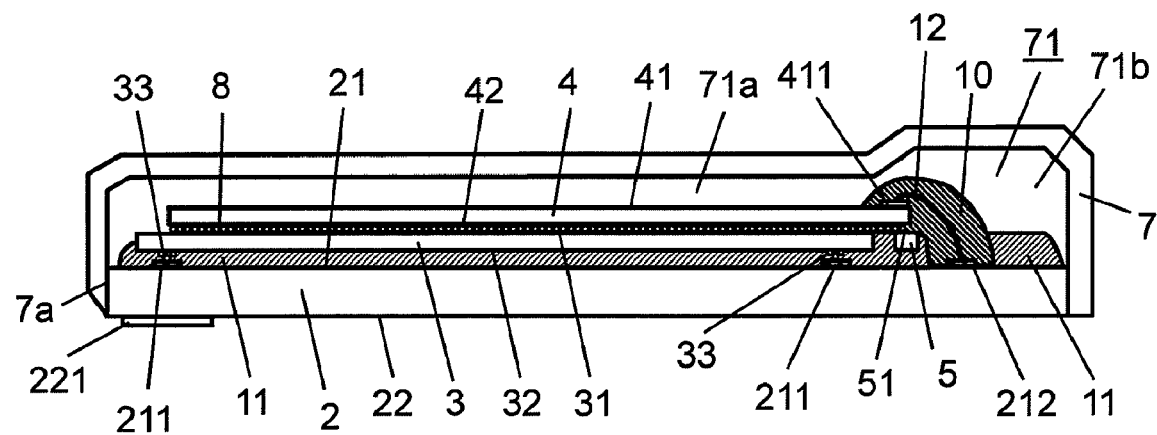
FIG. 8 is a sectional view taken along line C-C in the memory card in FIG. 7.

FIG. 7 is a plan view of an internal structure of a memory card in the second exemplary embodiment of the present invention. FIG. 8 is a sectional view taken along line C-C in the memory card in FIG. 7. Also in FIG. 7, only an outline of cover 7 is indicated using a dotted line so as to facilitate understanding of the internal structure of the memory card, same as in the first exemplary embodiment. In FIG. 8, primary sealing resin 11 and secondary sealing resin 10 are omitted from illustration.

As shown in FIGS. 7 and 8, at least third semiconductor chip 5 and non-semiconductor chip component 6 are mounted side by side on one side of circuit board 2 in memory card 1b in the second exemplary embodiment. In addition, board electrodes 212 on circuit board 2 are distributed on both sides of facing area 101 where third semiconductor chip 5 faces second semiconductor chip 4. These points differ from the first exemplary embodiment. It is preferable to fix top face 31 of first semiconductor chip 3 and bottom face 42 of second semiconductor chip 4 in a positionally-displaced manner so that top face 31 and bottom face 42 are at least not partially overlaid. In addition, third semiconductor chip 5 and second semiconductor chip 4 are preferably provided such that they are overlaid in facing area 101. Other components, materials, and basic functions are the same as that in the first exemplary embodiment, and thus their description may be omitted.

Memory card 1b is detailed below with reference to FIGS. 7 and 8.

In memory card 1b, multiple non-semiconductor chip components 6 are mounted side by side with third semiconductor chip 5 along one side of circuit board 2. This can be realized because third semiconductor chip 5, which is a control chip, is smaller in size than first semiconductor chip 3 or second semiconductor chip 4, which are memory chips.

Board electrodes 212 on circuit board 2, which are connected to second semiconductor electrodes 411 of second semiconductor chip 4 by wires 12, are disposed on both sides of facing area 101 where one side of second semiconductor chip 4 faces third semiconductor chip 5. In this case, as shown in FIG. 7, board electrodes 212 are distributed along adjoining two sides of second semiconductor chip 4 at both sides of facing area 101. In addition, one line of distributed board electrodes 212 is provided between non-semiconductor chip components 6 and second semiconductor chip 4.

As shown in FIG. 7, second semiconductor electrodes 411 aligned along one side of second semiconductor chip 4 are preferably distributed corresponding to distributed and aligned board electrodes 212. This enables connection of second semiconductor electrodes 411 and board electrode 212 using wire 12 with an almost equivalent length so as to avoid any delay difference in signals.

The above structure enables further downsizing of circuit board 2, compared to the structure of providing third semiconductor chip 5 independently on one side of circuit board 2. Accordingly, a larger memory chip with a higher memory capacity can be mounted on a memory card whose shape is standardized.

Still more, although an alignment area of board electrodes 212 is limited by disposing third semiconductor chip 5 and non-semiconductor chip components 6 side by side, a number of board electrodes 212 required can be provided without requiring an extra space by distributing and disposing board electrodes 212 on both sides of facing area 101 where one side of second semiconductor chip 4 faces third semiconductor chip 5.

Still more, second semiconductor chip 4 is positionally-displaced toward the side where board electrodes 212 are distributed and aligned so that a least a part of top face 31 of first semiconductor chip 3 and a part of bottom face 42 of second semiconductor chip 4 are not overlaid. For example, as shown in FIG. 7, second semiconductor chip 4 is fixed positionally-displaced in an upper right direction, relative to first semiconductor chip 3. More specifically, second semiconductor chip 4 overhang to the right side in FIG. 8, relative to first semiconductor chip 3, and second semiconductor chip 4 is fixed in a state overhung upward in FIG. 7. In this way, a sufficient distance is secured from board electrodes 212 on circuit board 2 to first semiconductor chip 3. In addition, third semiconductor chip 5 can be fixed at a short distance from board electrodes 212 in a plan view while securing a sufficient distance in a thickness direction. As a result, the length of wire 12 for connecting second semiconductor electrode 411 of second semiconductor chip 4 and board electrode 212 of circuit board 2 can be shortened so as to prevent electrical interference or noise influence between first semiconductor chip 3 or second semiconductor chip 4 and board electrodes 212. If electrical interference is small, first semiconductor chip 3 and second semiconductor chip 4 may be laminated and fixed without positional displacement.

As shown in FIGS. 7 and 8, bottom face 42 of second semiconductor chip 4 and top face 51 of third semiconductor chip 5 face each other, and are overlaid in facing area 101. In this case, second semiconductor chip 4 and third semiconductor chip 5 are fixed by fixing material 8 in facing area 101 where they are overlaid. This improves a support strength of second semiconductor chip 4 overhanging from first semiconductor chip 3, and thus reliability against bending deformation of memory card 1b improves.

Memory card 1a in the second exemplary embodiment can be manufactured using the manufacturing method same as that of memory card 1 in the first exemplary embodiment, and thus their description is omitted here.

As described above, the second exemplary embodiment achieves the effect same as the first exemplary embodiment.

In memory card 1 in the first exemplary embodiment, second semiconductor electrodes 411 and board electrodes are connected by long wires 12 passing over primary sealing resin 11 around first semiconductor chip 3 and third semiconductor chip 5, which are directly mounted on circuit board 2. To reduce a stress applied to wire 12, the height of wire 12 also needs to be made higher. However, in the second exemplary embodiment, wire 12 is connected to second semiconductor chip 4 in an overhung state. This shortens the length and also the height of wire 12. As a result, wire 12 can be reliably bonded with less deformation and deviation in shape. A highly reliable memory card with improved process in wire-bonding process can be manufactured at a low cost.

Still more, bending or vibration at an overhung portion of second semiconductor chip 4, which often occurs at wire-bonding, can be reduced by fixing a portion of second semiconductor chip 4 overhanging from first semiconductor chip 3 onto primary sealing resin 11 and top face 51 of third semiconductor chip 5 via fixing material 8. This achieves connection of wire 12 and second semiconductor electrode 411 in a reliable wire shape. Still more, cracking or chipping of second semiconductor chip 4 due to bending or vibration is also preventable.

The second exemplary embodiment refers to the case that an overhung end of second semiconductor chip 4 overhanging from first semiconductor chip 3 reaches top face 51 of third semiconductor chip 5. However, the present invention is not limited to this structure. For example, if the length of wire 12 can be shortened, depending on sizes and layout of first semiconductor chip 3, second semiconductor chip 4, and third semiconductor chip 5; the overhung end of second semiconductor chip 4 may not necessarily reach top face 51 of third semiconductor chip 5.

The exemplary embodiments of the present invention are described above. However, the present invention is not limited to the above exemplary embodiments. Diversifying modifications as shown below are applicable.

More specifically, each exemplary embodiment refers to the case that first semiconductor chip 3 and second semiconductor chip 4 are memory chips and third semiconductor chip 5 is a control chip. However, the present invention is not limited to this structure. For example, other bare chips, such as ASIC, may be used as first semiconductor chip 3, second semiconductor chip 4, and third semiconductor chip 5. In addition, another memory chip may be laminated on second semiconductor chip 4 and connected to circuit board 2 by wire, and third semiconductor chip 5, which is a control chip, may control these three memory chips.

As third semiconductor chip 5, a chip functioning as both memory and controller for storing information and controlling other memory chip may be mounted on circuit board 2. In this case, a semiconductor chip may not have a semiconductor function as a whole, as long as a part of it has semiconductor function.

The exemplary embodiments refer to the case of forming a bump as first semiconductor electrode 33 or third semiconductor electrode 53. However, the present invention is not limited to this structure. For example, a bump may be formed on board electrodes 211 on circuit board 2 at a position corresponding to first semiconductor electrode 33 or third semiconductor electrode 53. Still more, a ball bump, plating bump, or solder bump may be used in addition to a stud bump.

Still more, the exemplary embodiments refer to the case of attaching NCF as primary sealing resin 11. However, the present invention is not limited to this structure. For example, the primary sealing resin may be formed by applying non-conductive resin paste or by using an anisotropic conductive resin film or anisotropic conductive resin paste.

Still more, the exemplary embodiments refer to the case of attaching first sealing resin 11 to mounting areas of first semiconductor chip 3 and third semiconductor chip 5 at the same time, and bonding first semiconductor chip 3 and third semiconductor chip 5 on circuit board 2 at the same time. However, the present invention is not limited to this structure. For example, primary sealing resin 11 may be attached to the mounting areas of first semiconductor chip 3 and the mounting area of third semiconductor chip 5 separately so as to bond first semiconductor chip 3 to circuit board 2 and then bond third semiconductor chip 5 to circuit board 2.

Still more, the exemplary embodiments refer to attachment of a molded cover made of resin to the circuit board. However, the present invention is not limited to this structure. As required, the cover may be molded on circuit board 2 using thermoplastic resin or thermosetting resin. However, with respect to the point of simplifying the manufacture of memory cards, the cover is preferably a molded component. With respect to the point of increasing safety by reducing the hardness of cover, the cover is preferably molded using thermoplastic resin.

The exemplary embodiments also refer to SD card as a memory card. However, the present invention is also applicable to other card-type recording media, such as an IC card.

INDUSTRIAL APPLICABILITY

The present invention is effectively applicable to technical fields of information recording, including memory cards where downsizing and thinning are particularly demanded.

The invention claimed is:

1. A memory card comprising:
a circuit board including at least a board electrode on a top face of the circuit board and an external electrode on a bottom face of the circuit board;
a first semiconductor chip flip-chip mounted on the top face of the circuit board, the first semiconductor chip including a first semiconductor electrode;
a second semiconductor chip including a second semiconductor electrode on a top face of the second semiconductor chip;
a third semiconductor chip flip-chip mounted in an area on the top face of the circuit board, the area being different from an area where the first semiconductor chip is mounted, the third semiconductor chip including a third semiconductor electrode;
a wire for connecting the second semiconductor electrode and the board electrode;
a cover for covering a circuit formation area, the circuit formation area including the first semiconductor chip, the second semiconductor chip, the third semiconductor chip, and the wire provided on the top face of the circuit board;
a primary sealing resin for sealing the first semiconductor chip and the third semiconductor chip;
a secondary sealing resin for sealing only the wire and an area near the wire;
wherein a bottom face of the second semiconductor chip is smaller than a top face of the first semiconductor chip, and the bottom face of the second semiconductor chip and the top face of the first semiconductor chip face each other and are laminated and fixed.

2. The memory card of claim 1, further comprising:
a non-semiconductor chip component mounted in an area on the top face of the circuit board, the area being different from areas where the first semiconductor chip and the third semiconductor chip are mounted.

3. The memory card of claim 1, further comprising:
a fixing material for fixing at least the top face of the first semiconductor chip and the bottom face of the second semiconductor chip.

4. The memory card of claim 2, wherein the cover is made of thermoplastic resin, the cover including a cavity for housing the circuit formation area of the circuit board, the cavity being attached to the circuit board through an opening in the cavity.

5. The memory card of claim 4, wherein the cavity includes a first concave portion for housing at least a part of the first semiconductor chip and a part of the second semiconductor chip, and a second concave portion for housing at least the non-semiconductor chip component and the wire.

6. The memory card of claim 1, wherein a non-semiconductor chip component and the third semiconductor chip are mounted on one side of the circuit board, wherein the second semiconductor electrode comprises a plurality of second semiconductor electrodes, and the board electrode comprises a plurality of board electrodes connected to the second semiconductor electrodes of the second semiconductor chip by the wire, the board electrodes being distributed and aligned on both sides of a facing area, the facing area being an area where the third semiconductor chip faces the second semiconductor chip.

7. The memory card of claim 6, wherein the second semiconductor electrodes of the second semiconductor chip are distributed and disposed corresponding to the distributed board electrodes.

8. The memory card of claim 6, wherein a part of the bottom face of the second semiconductor chip is not overlaid on the first semiconductor chip at a side where the second semiconductor chip faces the distributed board electrodes on the circuit board.

9. The memory card of claim 6, wherein a part of the bottom face of the second semiconductor chip and a part of the top face of the third semiconductor chip face each other and are fixed.

10. The memory card of claim 1, wherein the first semiconductor chip and the second semiconductor chip are memory chips storing information, and the third semiconductor chip is a control chip for controlling the first semiconductor chip and the second semiconductor chip.

11. A method of manufacturing a memory card, comprising:

mounting a first semiconductor chip on a top face of a circuit board by a flip-chip method;

laminating and fixing a second semiconductor chip and the first semiconductor chip by a fixing material, a bottom face of the second semiconductor chip and at least a part of a top face of the first semiconductor chip facing each other, the bottom face of the second semiconductor chip being smaller than the top face of the first semiconductor chip;

mounting a third semiconductor chip in an area on the top face of the circuit board by the flip-chip method, the area being different from an area where the first semiconductor chip is mounted;

connecting a second semiconductor electrode on a top face of the second semiconductor chip and a board electrode on the top face of the circuit board by a wire;

sealing the second the first semiconductor chip and the third semiconductor chip with a primary sealing resin;

sealing only the wire and an area near the wire with a secondary sealing resin; and covering a circuit formation area with a cover, the circuit formation area including the first semiconductor chip, the second semiconductor chip, the third semiconductor chip, and the wire provided on the top face of the circuit board.

12. The memory card of claim 1, wherein the cover is made of thermoplastic resin, the cover including a cavity for housing the circuit formation area of the circuit board, the cavity being attached to the circuit board through an opening in the cavity.

* * * * *